(12) United States Patent
Kashiwagi

(10) Patent No.: US 10,855,944 B2
(45) Date of Patent: Dec. 1, 2020

(54) SOLID-STATE IMAGE PICKUP APPARATUS

(71) Applicants: Kabushiki Kaisha Toshiba, Tokyo (JP); Toshiba Electronic Devices & Storage Corporation, Tokyo (JP)

(72) Inventor: Minoru Kashiwagi, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/276,871

(22) Filed: Feb. 15, 2019

(65) Prior Publication Data
US 2020/0092510 A1 Mar. 19, 2020

(30) Foreign Application Priority Data
Sep. 14, 2018 (JP) ................. 2018-172727

(51) Int. Cl.
*H04N 5/374* (2011.01)
*H04N 5/3745* (2011.01)
*H01L 27/146* (2006.01)
*H04N 5/355* (2011.01)

(52) U.S. Cl.
CPC ... *H04N 5/37457* (2013.01); *H01L 27/14603* (2013.01); *H01L 27/14612* (2013.01); *H01L 27/14621* (2013.01); *H01L 27/14645* (2013.01); *H04N 5/3559* (2013.01)

(58) Field of Classification Search
CPC .............. H04N 5/37457; H04N 5/3559; H01L 27/14612; H01L 27/14603; H01L 27/14621; H01L 27/14645
See application file for complete search history.

(56) References Cited

U.S. PATENT DOCUMENTS

| 7,898,586 | B2 | 3/2011 | Kashiwagi | |
| 2014/0252201 | A1* | 9/2014 | Li | H01L 27/14616 |
| | | | | 250/208.1 |

FOREIGN PATENT DOCUMENTS

| JP | 4686310 B2 | 5/2011 |
| JP | 4734270 B2 | 7/2011 |
| JP | 2013-153091 A | 8/2013 |
| JP | 2015-019004 A | 1/2015 |

* cited by examiner

*Primary Examiner* — Twyler L Haskins
*Assistant Examiner* — Angel L Garces-Rivera
(74) *Attorney, Agent, or Firm* — White & Case LLP

(57) ABSTRACT

A solid-state image pickup apparatus includes a light receiving element, a reading gate, a former-stage storage unit, a latter-stage storage unit, a floating diffusion, an amplification transistor, a reset transistor, and an address transistor. The former-stage storage unit stores a signal charge read from the light receiving element. The latter-stage storage unit stores the signal charge transported from the former-stage storage unit. The floating diffusion converts the signal charge transferred from the latter-stage storage unit into a signal voltage.

16 Claims, 8 Drawing Sheets

SOLID-STATE IMAGE PICKUP APPARATUS

CROSS-REFERENCE TO RELATED APPLICATION

This application is based upon and claims the benefit of priority from the prior Japanese Patent Application No. 2018-172727 filed on Sep. 14, 2018; the entire contents of which are incorporated herein by reference.

FIELD

An embodiment described herein relates generally to a solid-state image pickup apparatus.

BACKGROUND

Conventionally, a solid-state image pickup apparatus such as a color linear image sensor has existed. In the solid-state image pickup apparatus, a plurality of pixels are linearly arranged in a main scanning direction. In the solid-state image pickup apparatus, pixels of respective colors such as red, green, and blue are arranged in parallel in a sub scanning direction perpendicular to the main scanning direction.

The solid-state image pickup apparatus sequentially shifts a reading line provided in the main scanning direction to the sub scanning direction, and reads pixels of each color to output pixel signals of each color. In the solid-state image pickup apparatus, depending on a deviation among start times of reading cycles of the respective colors, cycles of the pixel signals of the respective colors also deviate.

The pixel signal of each color outputted from the solid-state image pickup apparatus has the deviation of the cycle corrected by a correction apparatus provided separately, and is combined into a picked-up image. An image pickup apparatus having the solid-state image pickup apparatus increases in size, manufacturing cost, and power consumption due to the correction apparatus.

DETAILED DESCRIPTION

A solid-state image pickup apparatus according to an embodiment has a light receiving element, a reading gate, a former-stage storage unit, a latter-stage storage unit, a floating diffusion, an amplification transistor, a reset transistor, and an address transistor. The light receiving element has a color filter, and photoelectrically converts incident light. The reading gate reads a signal charge from the light receiving element. The former-stage storage unit stores the signal charge read from the light receiving element. The latter-stage storage unit stores the signal charge transported from the former-stage storage unit. The floating diffusion converts the signal charge transferred from the latter-stage storage unit into a signal voltage. The amplification transistor generates a pixel signal corresponding to the signal voltage. The reset transistor resets a gate voltage of the amplification transistor to a reference voltage. The address transistor outputs the pixel signal.

Embodiment

An embodiment will be described below with reference to the drawings.

Figure 1:
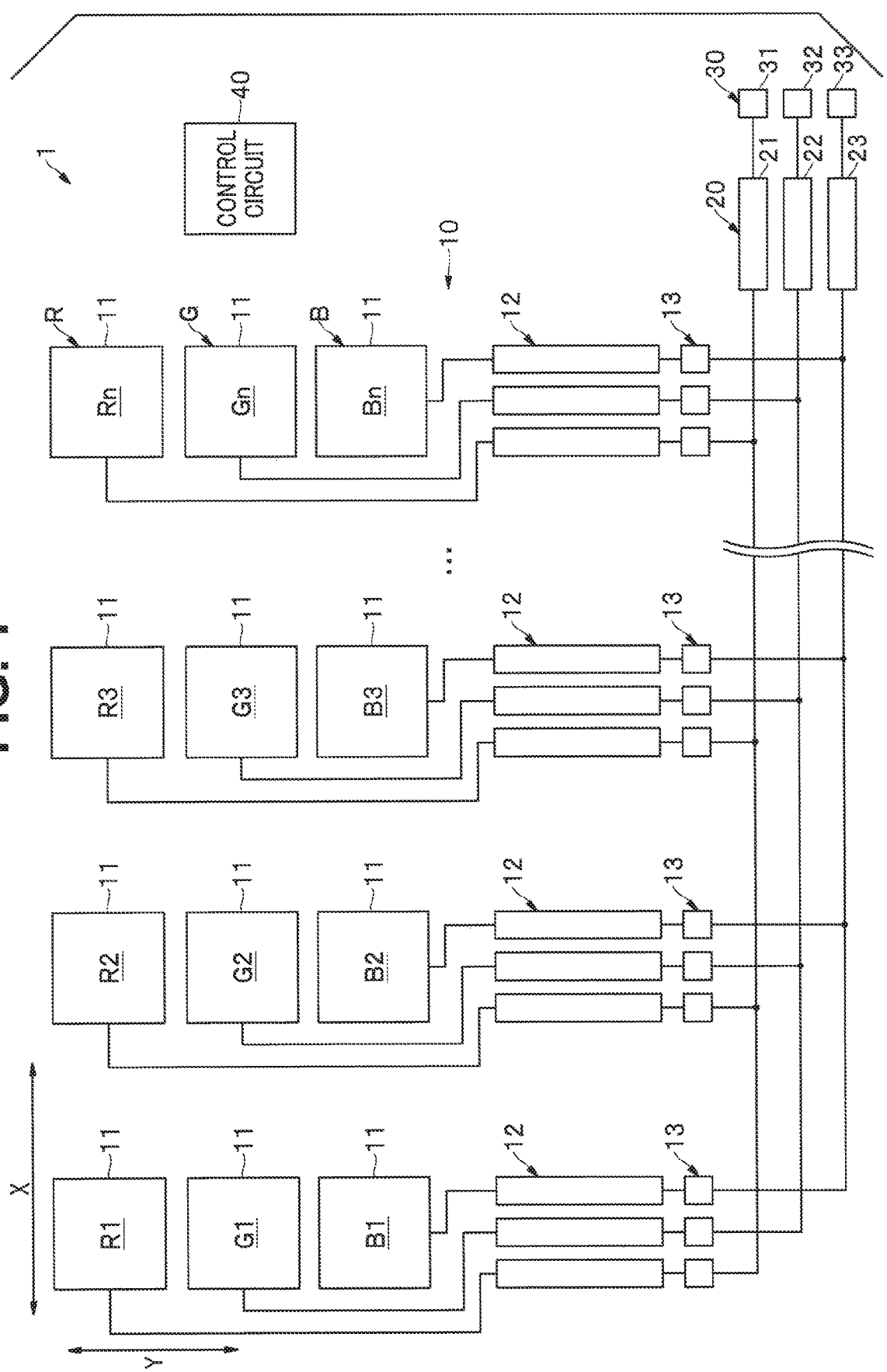
FIG. 1 is a block diagram showing an example schematic configuration of a solid-state image pickup apparatus according to an embodiment.
Figure 2:
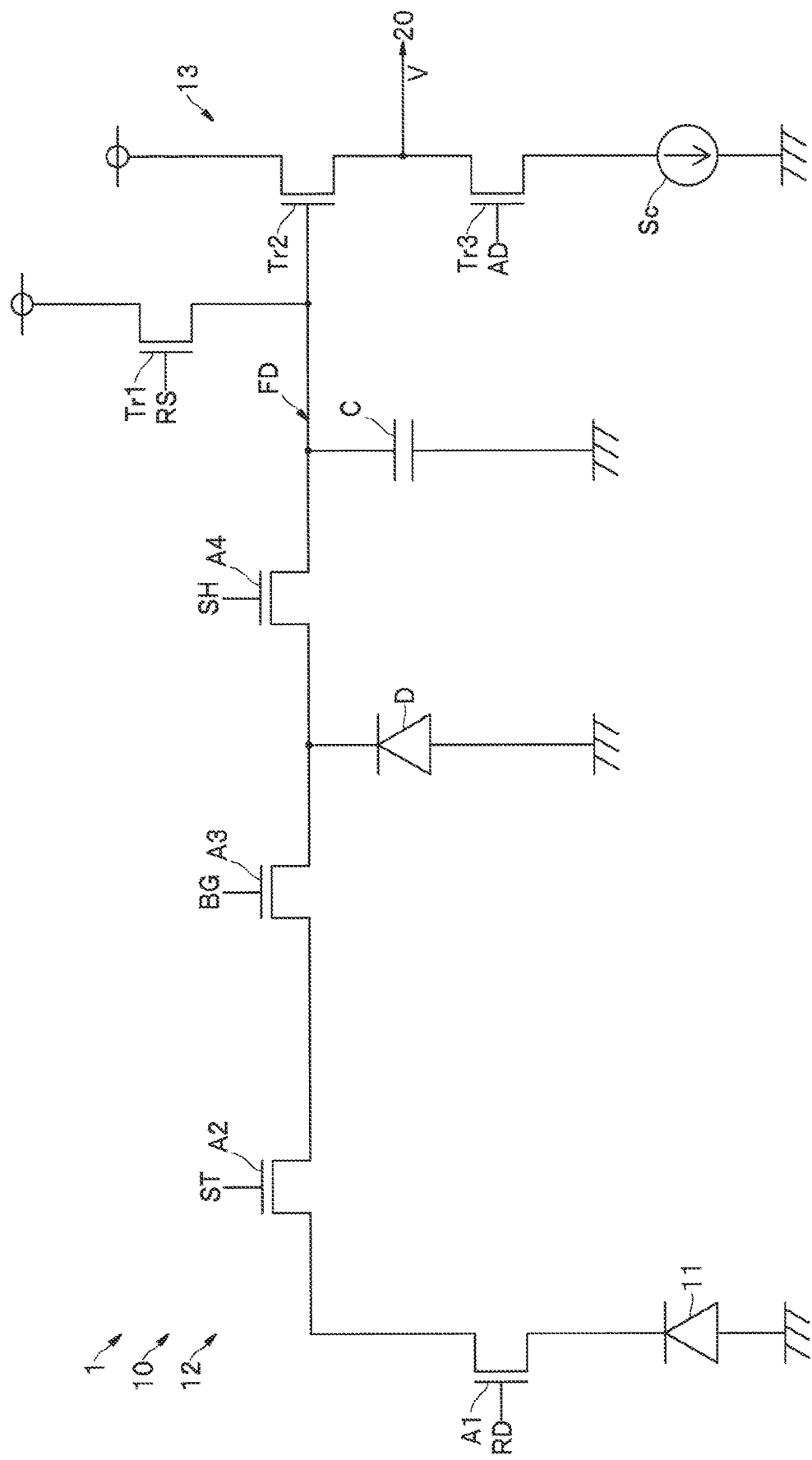
FIG. 2 is a circuit diagram showing an example of a pixel of the solid-state image pickup apparatus according to the embodiment.

FIG. 1 is a block diagram showing an example schematic configuration of a solid-state image pickup apparatus 1. FIG. 2 is a circuit diagram showing an example of a pixel 10 of the solid-state image pickup apparatus 1.

As shown in FIG. 1, the solid-state image pickup apparatus 1 has a plurality of pixels 10, an output circuit 20, an output terminal 30 and a control circuit 40. The plurality of pixels 10 output a pixel signal V to the output terminal 30 via the output circuit 20. The plurality of pixels 10 are controlled by the control circuit 40.

The plurality of pixels 10 are linearly arranged in a main scanning direction X on a pixel array. In the plurality of pixels 10, first color pixels R1-Rn such as red pixels, second color pixels G1-Gn such as green pixels, and third color pixels B1-Bn such as blue pixels are arranged in parallel in a sub scanning direction Y perpendicular to the main scanning direction X.

Hereinafter, all or part of the first color pixels R1-Rn will be referred to as a first color pixel R, all or part of the second color pixels G1-Gn will be referred to as a second color pixel G, and all or part of the third color pixels B1-Bn will be referred to as a third color pixel B.

All or part of the first color pixels R1-Rn, the second color pixels G1-Gn, and the third color pixels B1-Bn will be referred to as a pixel 10.

Each of the pixels 10 has a light receiving element 11, a charge transfer circuit 12, and a charge-voltage conversion circuit 13.

As shown in FIG. 2, the light receiving element 11 has, for example, a photodiode capable of performing photoelectric conversion. The photodiode has an anode connected to a ground voltage, and has a cathode connected to the charge transfer circuit 12. The photodiode is provided with a color filter which transmits a predetermined color component. When exposed, the light receiving element 11 photoelectrically converts incident light to store a signal charge.

The charge transfer circuit 12 reads the signal charge from the light receiving element 11 for transfer to the charge-voltage conversion circuit 13. The charge transfer circuit 12 has a reading gate A1, a storage gate A2, a barrier gate A3, a storage diode D, and a transfer gate A4. The reading gate A1, the storage gate A2, the barrier gate A3, and the transfer gate A4 are connected in series in the order.

The reading gate A1 reads the signal charge stored in the light receiving element 11 to the storage gate A2 in response to a reading signal RD inputted from the control circuit 40.

A storage signal ST is inputted from the control circuit 40 to the storage gate A2, which has a stored charge amount corresponding to the storage signal ST, and stores the signal charge read from the reading gate A1.

The barrier gate A3 transports the signal charge stored in the storage gate A2 to the storage diode D in response to a barrier signal BG inputted from the control circuit 40.

The storage diode D has a cathode connected to an output terminal of the barrier gate A3 and an input terminal of the transfer gate A4, and has an anode connected to the ground voltage. The storage diode D stores the signal charge transported from the barrier gate A3.

The transfer gate A4 transfers the signal charge stored in the storage diode D to the charge-voltage conversion circuit 13 in response to a transfer signal SH inputted from the control circuit 40.

The charge-voltage conversion circuit 13 converts the signal charge transferred from the charge transfer circuit 12 into a signal voltage, and outputs a pixel signal V to the output circuit 20. The charge-voltage conversion circuit 13 has a floating diffusion FD, a reset transistor Tr1, an amplification transistor Tr2, an address transistor Tr3, and a constant current source Sc. Although each of the reset transistor Tr1, the amplification transistor Tr2, and the address transistor Tr3 is composed of, for example, an n-type transistor, composition using a p-type transistor is also possible.

The floating diffusion FD has a capacitor C. The capacitor C has one end connected to the transfer gate A4 and a gate of the amplification transistor Tr2, and has the other end connected to the ground voltage. The capacitor C converts the signal charge transferred from the transfer gate A4 into the signal voltage.

The reset transistor Tr1 has one end connected to the reference voltage, and has the other end connected to the floating diffusion FD. The reset transistor Tr1 connects the floating diffusion FD to the reference voltage to discharge the signal charge in response to a reset signal RS inputted from the control circuit 40.

The amplification transistor Tr2 has one end connected to a power supply voltage, and has the other end connected to the address transistor Tr3 and the output circuit 20. The amplification transistor Tr2 performs source follower operation when connected to the constant current source Sc to output to the output circuit 20 the pixel signal V corresponding to the signal voltage of the floating diffusion FD inputted to the gate.

The address transistor Tr3 is provided between the other end of the amplification transistor Tr2 and the constant current source Sc. The address transistor Tr3 has a gate connected to the control circuit 40, and brings the constant current source Sc and the amplification transistor Tr2 into either a connected state or a disconnected state depending on an address signal AD inputted from the control circuit 40.

The constant current source Sc is provided between the amplification transistor Tr2 and the ground voltage.

Returning to FIG. 1, the output circuit 20 has an output circuit 21 connected to first color pixels R, an output circuit 22 connected to second color pixels G, and an output circuit 23 connected to third color pixels B. The output circuit 20 performs predetermined signal processing such as amplification on pixel signals V inputted from the plurality of pixels 10 for output to the output terminal 30.

The output terminal 30 has an output terminal 31 connected to the output circuit 21 to output a pixel signal Vr, an output terminal 32 connected to the output circuit 22 to output a pixel signal Vg, and an output terminal 33 connected to the output circuit 23 to output a pixel signal Vb. Hereinafter, all or part of the pixel signals Vr, Vg, Vb will be referred to as a pixel signal V.

The control circuit 40 is composed of, for example, a shift resister.

The control circuit 40 outputs the reading signal RD to instruct to read the signal charge stored in the light receiving element 11 according to a color of a pixel 10. More specifically, the control circuit 40 outputs the reading signal RD according to an exposure cycle of a pixel 10 of each color so that a charge can be stored in the pixel 10 of each color in response to movement of a reading line in the sub scanning direction Y. The exposure cycle is determined corresponding to the color of the pixel 10. When the reading signal RD enters an OFF state, the reading gate A1 enters a disconnected state, so that a signal charge is stored in the light receiving element 11. When the reading signal RD enters an ON state, the reading gate A1 enters a connected state, so that the signal charge is read from the light receiving element 11 to the storage gate A2.

The control circuit 40 outputs the storage signal ST at a predetermined voltage to the storage gate A2.

The control circuit 40 outputs the barrier signal BG to instruct to transport the signal charge of the pixel 10 of each color in the storage gate A2 before start of a signal output cycle. For example, the control circuit 40 may simultaneously output the barrier signal BG to all the pixels 10 before start of the signal output cycle. When the barrier signal BG enters the ON state, the signal charge is read from the storage gate A2 to the storage diode D. When the barrier signal BG enters the OFF state, the storage diode D is disconnected from the storage gate A2.

The control circuit 40 sequentially outputs the transfer signal SH corresponding to a position of the pixel 10 in the main scanning direction X in the signal output cycle to instruct to transfer the signal charge. When the transfer signal SH enters the ON state, the signal charge is transferred from the storage diode D to the floating diffusion FD. When the transfer signal SH enters the OFF state, the floating diffusion FD is disconnected from the storage diode D.

The control circuit 40 also outputs the address signal AD to instruct to output the pixel signal V. When the address signal AD enters the ON state, the amplification transistor Tr2 is connected to the constant current source Sc, so that the pixel signal V corresponding to the signal voltage of the floating diffusion FD is outputted to the output circuit 20. After outputting the pixel signal V of each of the pixels 10, the control circuit 40 brings the address signal AD into the OFF state to disconnect the constant current source Sc from the amplification transistor Tr2.

After outputting the pixel signal V of each of the pixels 10, the control circuit 40 outputs the reset signal RS to instruct to reset the signal charge. When the reset signal RS enters the ON state, the reference voltage and the floating diffusion FD are brought into the connected state, so that the floating diffusion FD is reset.

That is, the storage gate A2 composes the former-stage storage unit. The storage diode D composes the latter-stage storage unit.

The solid-state image pickup apparatus 1 has the light receiving element 11, the reading gate A1, the former-stage storage unit, the latter-stage storage unit, the floating diffusion FD, the amplification transistor Tr2, the reset transistor Tr1, and the address transistor Tr3. The light receiving element 11 has the color filter, and photoelectrically converts incident light. The reading gate A1 reads a signal charge from the light receiving element 1i. The former-stage storage unit stores the signal charge read from the light receiving element 11. The latter-stage storage unit stores the signal charge transported from the former-stage storage unit. The floating diffusion FD converts the signal charge transferred from the latter-stage storage unit into a signal voltage. The reset transistor Tr1 resets the gate voltage of the amplification transistor Tr2 to the reference voltage. The amplification transistor Tr2 generates a pixel signal V corresponding to the signal voltage. The address transistor Tr3 outputs the pixel signal V.

A plurality of light receiving elements 11 are provided, and the former-stage storage unit and the latter-stage storage unit are provided for each of a plurality of the light receiving elements 11.

The control circuit 40 controls a storage cycle of a signal charge in the former-stage storage unit for each color filter of a same color. More specifically, the control circuit 40 performs control so that the former-stage storage unit may store a signal charge in a storage cycle determined for each pixel having the color filter of the same color. More specifically, the light receiving element 11 has a color filter different in color in the sub scanning direction Y, and the control circuit 40 performs control so that the former-stage storage unit may store a signal charge in a storage cycle determined corresponding to the color of the color filter.

The control circuit 40 controls the pixel signal V of the pixels 10 having the color filter of each color to be synchronously outputted. More specifically, the control circuit 40 performs control so that a pixel 10 having the color filter of each color may be synchronized according to a position in the main scanning direction X perpendicular to the sub scanning direction Y to transfer the signal charge from the latter-stage storage unit to the floating diffusion FD.

(Operation)

Next, operation of the solid-state image pickup apparatus 1 according to the embodiment will be described.

Figure 3:
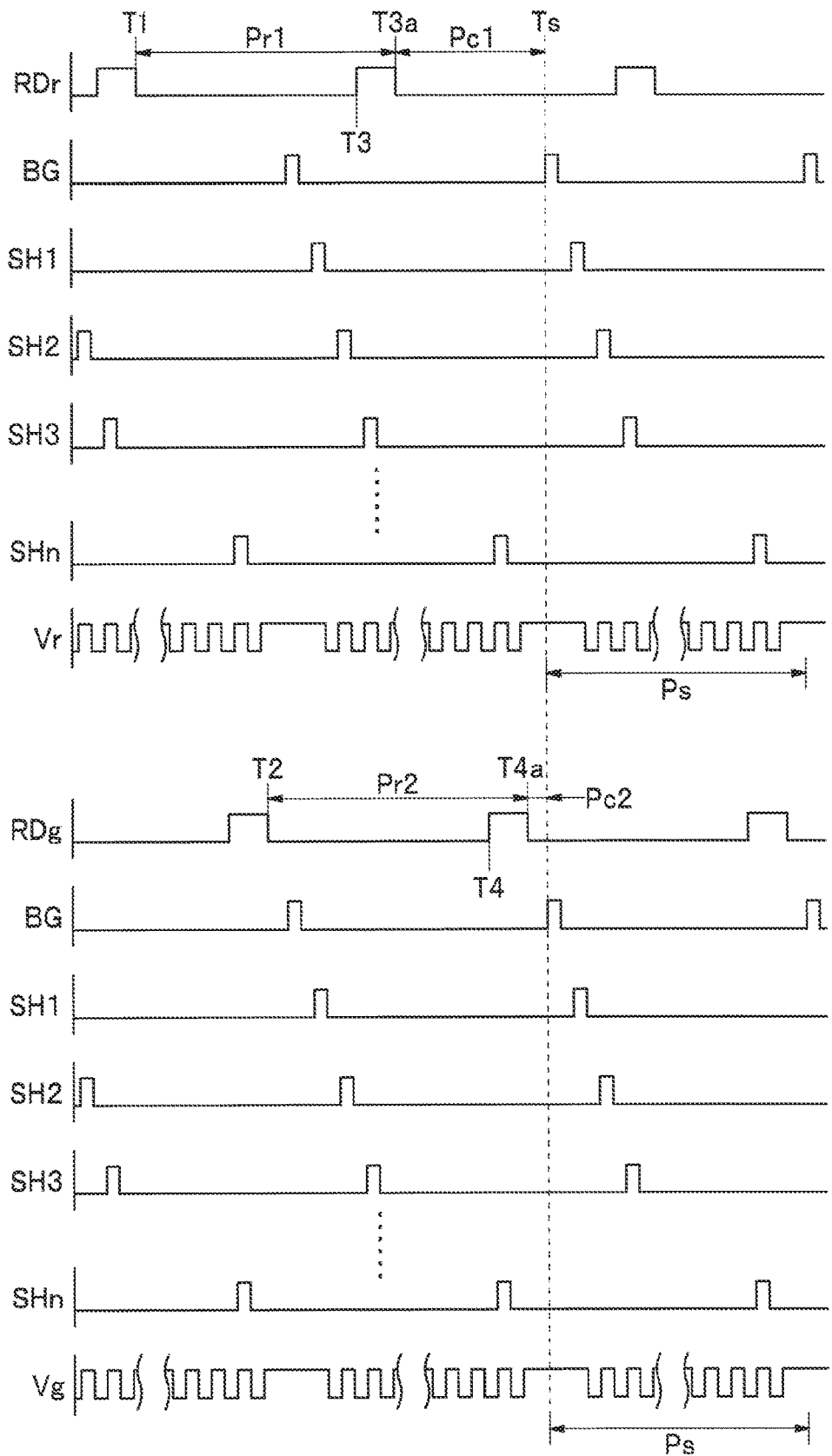
FIG. 3 is an example waveform diagram of a reading signal, a barrier signal, a transfer signal and a pixel signal of the solid-state image pickup apparatus according to the embodiment.

FIG. 3 is an example waveform diagram of the reading signal RD, the barrier signal BG, the transfer signal SH and the pixel signal V of the solid-state image pickup apparatus 1.

In the example of FIG. 3, an exposure cycle Pr2 of a second color pixel G is determined to be delayed by ½ cycle from an exposure cycle Pr1 of a first color pixel R. An exposure cycle of a third color pixel B is determined to be delayed by half a cycle from the exposure cycle Pr2 of the second color pixel G. That is, the exposure cycle of the third color pixel B is synchronized with the exposure cycle Pr1 of the first color pixel R with a delay of one cycle. Since operation of the third color pixel B is the same as the first color pixel R, the illustration and description are omitted. Hereinafter, all or part of the exposure cycles Pr1, Pr2 and the exposure cycle of the third color pixel B will be referred to as an exposure cycle Pr.

When the control circuit 40 outputs a reading signal RDr in the OFF state at a time T1, the light receiving element 11 and the charge transfer circuit 12 enter the disconnected state, so that the light receiving element 11 of the first color pixel R starts to store a signal charge by exposure. The exposure cycle Pr1 ranges from the time T1 to a time T3a.

The reading line moves in the sub scanning direction Y at a predetermined speed, and when a time T2 has come, the second color pixel G is arranged on the reading line. When the control circuit 40 outputs a reading signal RDg in the OFF state, the light receiving element 11 of the second color pixel G starts to store a signal charge by exposure. The exposure cycle Pr2 ranges from the time T2 to a time T4a.

Movement of the reading line may be implemented by a pixel array moving mechanism configured to move the pixel array in the sub scanning direction Y, or may be implemented by an object moving mechanism configured to move an object in the sub scanning direction Y.

When the control circuit 40 outputs the reading signal RDr in the ON state at a time T3, the reading gate A1 of the first color pixel R reads the signal charge from the light receiving element 11 to the storage gate A2 until the reading signal RDr in the OFF state is outputted at the time T3a. The storage gate A2 of the first color pixel R stores the signal charge in a storage cycle Pc1 from the time T3a to a time Ts.

When the control circuit 40 outputs the reading signal RDg in the ON state at a time T4, the reading gate A1 of the second color pixel G reads the signal charge from the light receiving element 11 to the storage gate A2 until the reading signal RDg in the OFF state is outputted at the time T4a. The storage gate A2 of the second color pixel G stores the signal charge in a storage cycle Pc2 from the time T4a to the time Ts.

When the time Ts has come, a signal output cycle Ps is started. When the control circuit 40 outputs the barrier signal BG in the ON state at the time Ts, the barrier gates A3 of all the pixels 10 transport the signal charges from the storage gates A2 to the storage diodes D.

Subsequently, when the control circuit 40 outputs the transfer signals SH1-SHn in the ON state, the transfer gate A4 of each of the pixels 10 arranged in the main scanning direction X sequentially transfers the signal charge from the storage diode D to the floating diffusion FD.

When the control circuit 40 outputs the address signal AD in the ON state, the amplification transistor Tr2 of each of the pixels 10 arranged in the main scanning direction X sequentially outputs a pixel signal V corresponding to a signal voltage of the floating diffusion FD.

More specifically, the first color pixel R outputs a pixel signal Vr corresponding to the signal charge stored during the exposure cycle Pr1 to the output circuit 21. The second color pixel G outputs a pixel signal Vg corresponding to the signal charge stored during the exposure cycle Pr2 to the output circuit 22. Although illustration is omitted, the third color pixel B also outputs a pixel signal Vb corresponding to a charge stored during the exposure cycle to the output circuit 23.

The output circuit 20 amplifies the pixel signal V for output to the output terminal 30.

The first color pixel R has a first former-stage storage unit, a first latter-stage storage unit, and a first charge-voltage conversion circuit 13. The first former-stage storage unit stores a first signal charge obtained by photoelectric conversion at the first exposure cycle Pr1 and read from a first light receiving element 11. The first signal charge is transported from the former-stage storage unit to the first latter-stage storage unit, which stores the first signal charge before start of the signal output cycle Ps. The first charge-voltage conversion circuit 13 outputs a first pixel signal Vr corresponding to the first signal charge transferred from the first latter-stage storage unit in the signal output cycle Ps.

The second color pixel G has a second former-stage storage unit, a second latter-stage storage unit, and a second charge-voltage conversion circuit 13. The second former-stage storage unit stores a second signal charge obtained by photoelectric conversion at a second exposure cycle Pr2 different from the first exposure cycle Pr1 and read from a second light receiving element 11. The second latter-stage storage unit stores the second signal charge transported from the second former-stage storage unit before start of the signal output cycle Ps. The second charge-voltage conversion circuit 13 outputs a second pixel signal Vg corresponding to the second signal charge transferred from the second latter-stage storage unit in the signal output cycle Ps.

Thus, the solid-state image pickup apparatus 1, in a pixel 10 of each color, reads and stores into the former-stage storage unit a signal charge into which incident light is photoelectrically converted at the exposure cycle Pr corresponding to the color, transports the signal charge from the former-stage storage unit to the latter-stage storage unit before start of the signal output cycle Ps, synchronizes pixels 10 of the respective colors for transfer from the latter-stage storage unit to the charge-voltage conversion circuit 13 in the signal output cycle Ps, and outputs a pixel signal V.

According to the embodiment, the solid-state image pickup apparatus 1 can synchronously output the pixel signal V of each color even when the exposure cycle Pr is different depending on the color of the pixel 10, so that it is possible to prevent the image pickup apparatus from increasing in size, manufacturing cost, and power consumption.

Modification 1 of the Embodiment

Although the former-stage storage unit is composed of the storage gate A2 in the embodiment, the former-stage storage unit may be composed of a storage diode Da.

Figure 4:
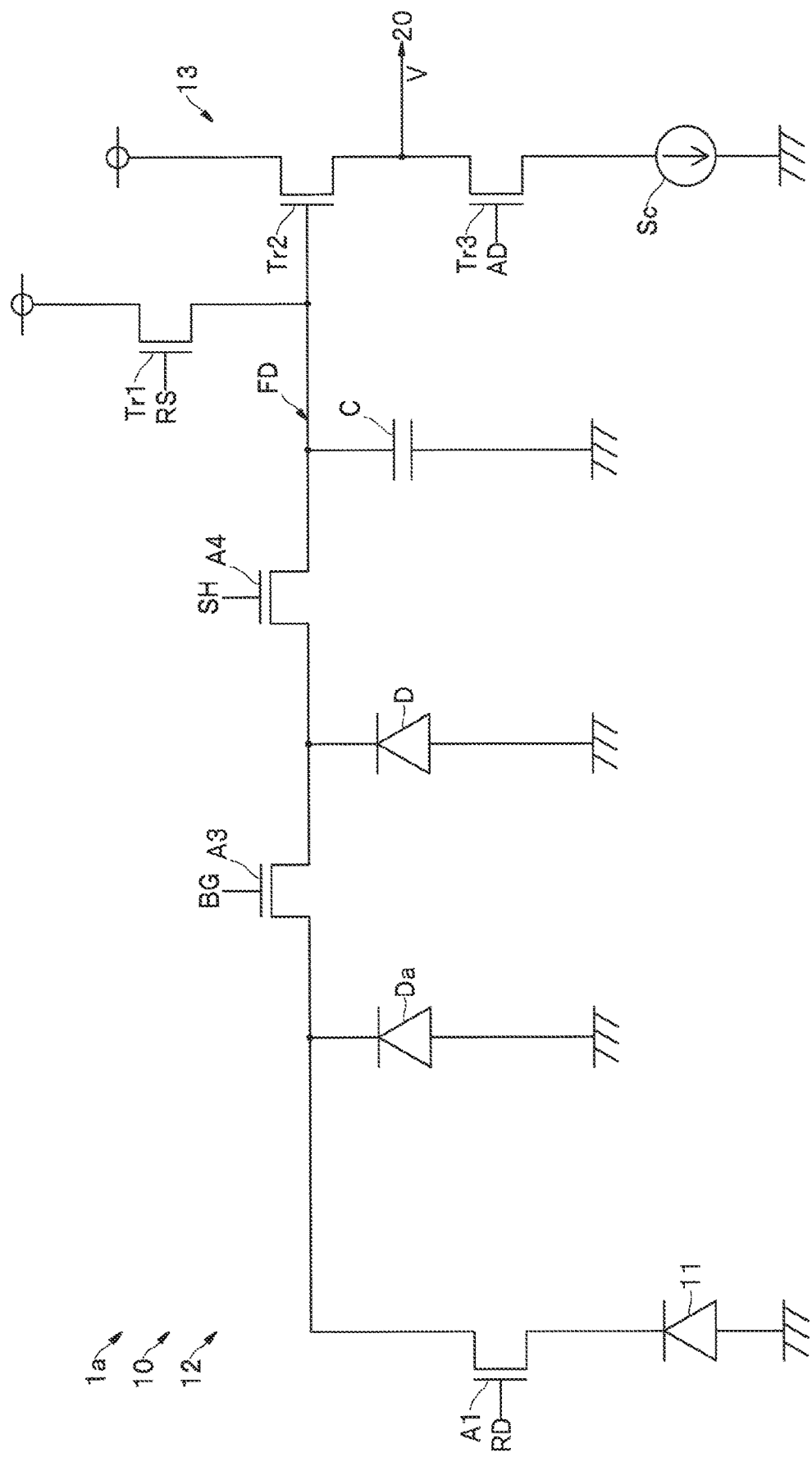
FIG. 4 is a circuit diagram showing an example of a pixel of a solid-state image pickup apparatus according to Modification 1 of the embodiment.

FIG. 4 is a circuit diagram showing an example of a pixel 10 of a solid-state image pickup apparatus 1a according to Modification 1 of the embodiment. In the modification, description of the same components as the components of the embodiment and the other modifications is omitted.

The solid-state image pickup apparatus 1a has the storage diode Da as the former-stage storage unit.

The storage diode Da has a cathode connected to an output terminal of the reading gate A1 and an input terminal of the barrier gate A3, and has an anode connected to the ground voltage. The storage diode Da stores a signal charge read from the reading gate A1.

When entering the ON state in response to the barrier signal BG, the barrier gate A3 transports the signal charge from the storage diode Da to the storage diode D.

Thus, in the solid-state image pickup apparatus 1a, the former-stage storage unit can be composed of the storage diode Da to further reduce dark current.

Modification 2 of the Embodiment

Although the barrier gate A3 is provided in the embodiment and Modification 1, the barrier gate A3 may not be provided.

Figure 5:
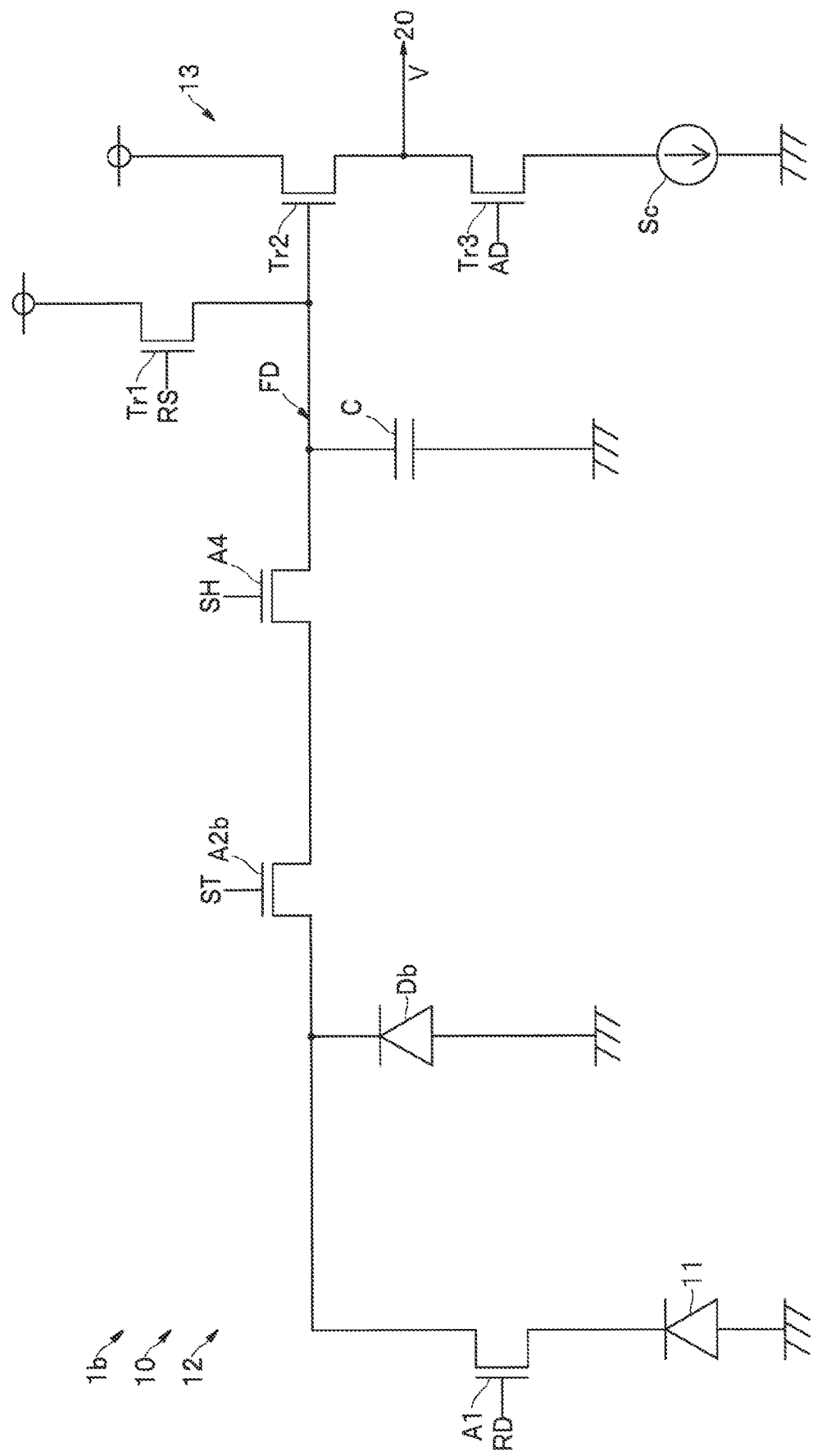
FIG. 5 is a circuit diagram showing an example of a pixel of a solid-state image pickup apparatus according to Modification 2 of the embodiment.
Figure 6:
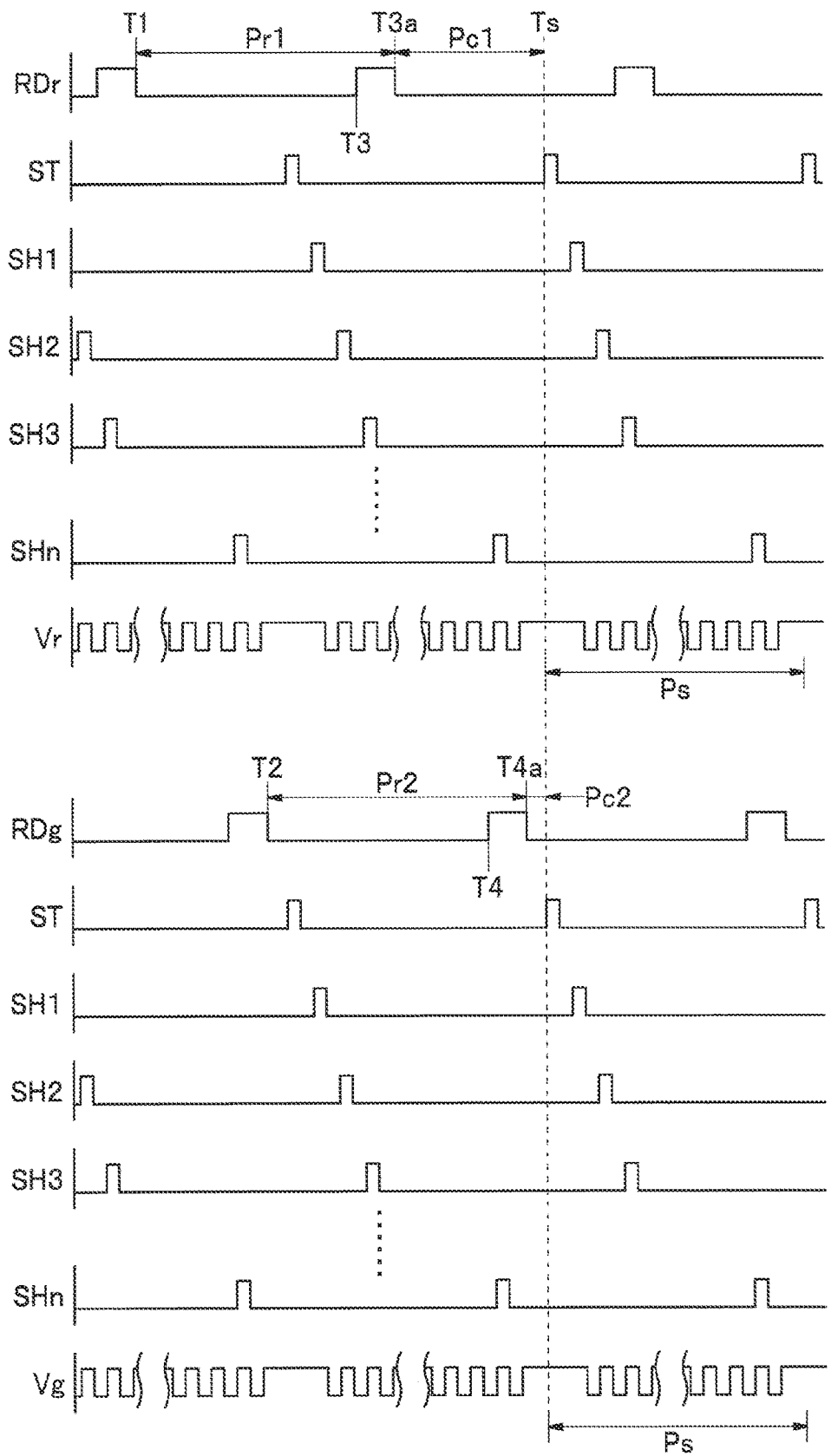
FIG. 6 is an example waveform diagram of a reading signal, a storage signal, a transfer signal and a pixel signal of the solid-state image pickup apparatus according to Modification 2 of the embodiment.

FIG. 5 is a circuit diagram showing an example of a pixel 10 of a solid-state image pickup apparatus 1b according to Modification 2 of the embodiment. FIG. 6 is an example waveform diagram of the reading signal RD, the storage signal ST, the transfer signal SH and the pixel signal V of the solid-state image pickup apparatus 1b. In the modification, description of the same components as the components of the embodiment and the other modifications is omitted.

The solid-state image pickup apparatus 1b has a storage diode Db as the former-stage storage unit, and a storage gate A2b as the latter-stage storage unit.

The storage diode Db has a cathode connected to an output terminal of the reading gate A1 and an input terminal of the storage gate A2b, and has an anode connected to the ground voltage. The storage diode Db stores a signal charge read from the reading gate A1.

The storage gate A2b is provided between the storage diode Db and the transfer gate A4. The storage gate A2b transports the signal charge from the storage diode Db for storage in response to the storage signal ST inputted from the control circuit 40.

The control circuit 40 outputs the storage signal ST to instruct to transport the signal charge in the storage diode Db of each of the pixels 10. More specifically, when the control circuit 40 brings the storage signal ST into the ON state, the signal charge is transported from the storage diode Db to the storage gate A2b to be stored according to potential formed in response to the storage signal ST.

As shown in FIG. 6, the exposure cycle Pr1 of the first color pixel R is started at the time T1. The exposure cycle Pr2 of the second color pixel G is started at the time T2.

The first color pixel R reads the signal charge from the light receiving element 11 to the storage diode Db at the time T3. The storage cycle Pc1 of the first color pixel R is started from the time T3a. The second color pixel G reads the signal charge from the light receiving element 11 to the storage diode Db at the time T4. The storage cycle Pc2 of the second color pixel G is started from the time T4a.

The signal output cycle Ps is started at the time Ts, and the storage gate A2b stores the signal charge transported from the storage diode Db. Subsequently, when the control circuit 40 outputs the transfer signal SH and the address signal AD, the charge-voltage conversion circuit 13 sequentially outputs the pixel signal V according to the signal charge transferred from the storage gate A2b.

According to the modification, the solid-state image pickup apparatus 1b can have a simpler configuration.

Modification 3 of the Embodiment

Although the pixel signal Vb of a third color pixel B is synchronized with the pixel signal Vr of a first color pixel R with a delay of one cycle in the embodiment and the other modifications, the pixel signal Vr may be synchronized with the pixel signal Vb without a delay of one cycle.

Figure 7:
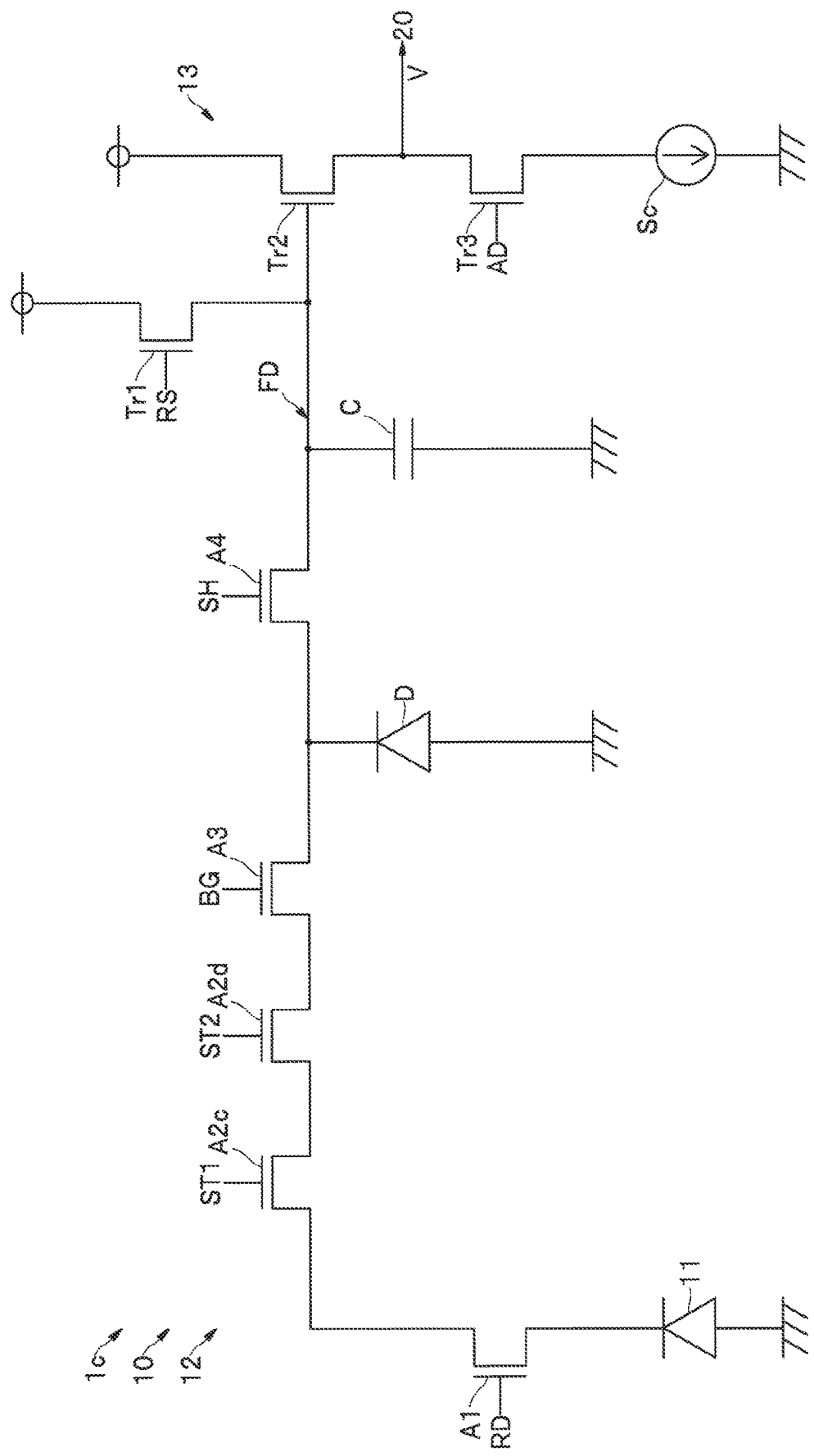
FIG. 7 is a circuit diagram showing an example of a pixel of a solid-state image pickup apparatus according to Modification 3 of the embodiment.
Figure 8:
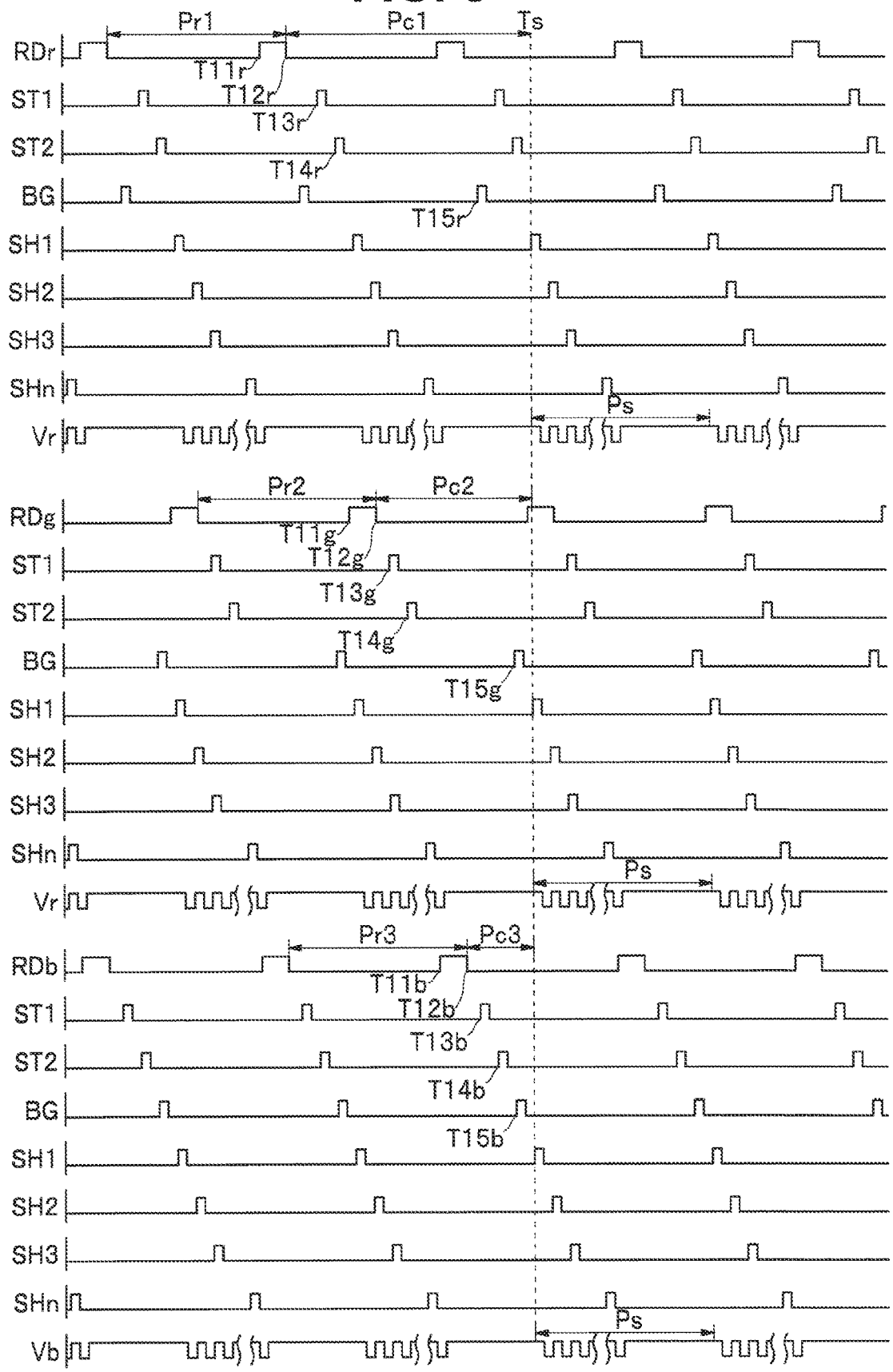
FIG. 8 is an example waveform diagram of a reading signal, storage signals, a barrier signal, a transfer signal and a pixel signal of the solid-state image pickup apparatus according to Modification 3 of the embodiment.

FIG. 7 is a circuit diagram showing an example of a pixel 10 of a solid-state image pickup apparatus 1c according to Modification 3 of the embodiment. FIG. 8 is an example waveform diagram of the reading signal RD, storage signals ST1, ST2, the barrier signal BG, the transfer signal SH and the pixel signal V of the solid-state image pickup apparatus 1c. In the modification, description of the same components as the components of the embodiment and the other modifications is omitted.

The solid-state image pickup apparatus 1c has a first storage gate A2c as a former-stage storage unit, a second storage gate A2d as an intermediate storage unit, and the storage diode D as a latter-stage storage unit.

The first storage gate A2c and the second storage gate A2d are provided in series between the reading gate A1 and the barrier gate A3.

The storage signal ST1 is inputted to the first storage gate A2c, which stores a signal charge read from the light receiving element 11 in response to the storage signal ST1.

The storage signal ST2 is inputted to the second storage gate A2d, which stores the signal charge transported from the first storage gate A2c in response to the storage signal ST2.

The control circuit 40 outputs the storage signals ST1, ST2 and the barrier signal BG, so that the signal charge into which incident light is photoelectrically converted at the exposure cycle Pr corresponding to the color of the pixel 10 is read and stored in the storage diode D before start of the signal output cycle Ps.

As shown in FIG. 8, the reading gate A1 reads a charge stored in the light receiving element 11 during the exposure cycle Pr1 in response to the reading signal RDr in the ON state outputted by the control circuit 40 from a time T11r to a time T12r.

When the control circuit 40 outputs the storage signal ST1 in the ON state at a time T13r, the storage gate A2c of the first color pixel R transports and stores the signal charge read by the reading gate A1.

When the control circuit 40 outputs the storage signal ST2 in the ON state at a time T14r, the storage gate A2d of the first color pixel R transports and stores the signal charge stored in the storage gate A2c.

When the control circuit 40 outputs the barrier signal BG in the ON state at a time T15r, the barrier gate A3 transports the signal charge stored in the storage gate A2d for storage in the storage diode D. The signal charge is stored in the storage cycle Pc1 from the time T12r to the time Ts.

The reading gate A1 reads a charge stored in the light receiving element 11 during the exposure cycle Pr2 in response to the reading signal RDg in the ON state outputted by the control circuit 40 from a time T11g to a time T12g.

The storage gate A2c of the second color pixel G transports and stores the signal charge read by the reading gate A1 at a time T13g.

The storage gate A2d of the second color pixel G transports and stores the signal charge stored in the storage gate A2c at a time T14g.

The barrier gate A3 transports the signal charge stored in the storage gate A2d for storage in the storage diode D at a time T15g. The signal charge is stored in the storage cycle Pc2 from the time T12g to the time Ts.

The reading gate A1 reads a charge stored in the light receiving element 11 during an exposure cycle Pr3 in response to a reading signal RDb in the ON state outputted by the control circuit 40 from a time T11b to a time T12b.

The storage gate A2c of the third color pixel B transports and stores the signal charge read by the reading gate A1 at a time T13b.

The storage gate A2d of the third color pixel B transports and stores the signal charge stored in the storage gate A2c at a time T14b.

The barrier gate A3 transports the signal charge stored in the storage gate A2d for storage in the storage diode D at a time T15b. The signal charge is stored in a storage cycle Pc3 from the time T12b to the time Ts.

When the signal output cycle Ps starts at the time Ts and the control circuit 40 outputs the transfer signal SH and the address signal AD, the charge-voltage conversion circuit 13 sequentially outputs a pixel signal V according to the signal charge transferred from the storage diode D.

That is, the intermediate storage unit is provided between the former-stage storage unit and the latter-stage storage unit, and stores the signal charge. The control circuit 40 controls the storage cycles Pc1, Pc2, Pc3 in which the former-stage storage unit, the intermediate storage unit and the latter-stage storage unit store the signal charge according to the colors of the color filters.

Thus, the solid-state image pickup apparatus 1c, in a pixel 10 of each color, reads and stores into the former-stage storage unit a signal charge into which incident light is photoelectrically converted at the exposure cycle Pr corresponding to the color, transports the signal charge from the former-stage storage unit to the latter-stage storage unit through the intermediate storage unit before start of the signal output cycle Ps, synchronizes pixels 10 of the respective colors for transfer from the latter-stage storage unit to the charge-voltage conversion circuit 13 in the signal output cycle Ps, and outputs a pixel signal V.

According to the modification, the solid-state image pickup apparatus 1c can synchronously output the pixel signals V of the respective colors without a delay of one cycle even when the exposure cycles Pr are different depending on the colors of the pixels 10.

Note that although the embodiment and the modifications have described examples in which a first color pixel R is a red pixel, a second color pixel G is a green pixel, and a third color pixel B is a blue pixel, no limitation exists. The first color pixel R may be a pixel other than a red one, the second color pixel G may be a pixel other than a green one, and the third color pixel B may be a pixel other than a blue one.

Note that although the embodiment and the modifications have described examples in which the light receiving element 11 is a photodiode, no limitation exists. The light receiving element 11 may be any element as long as photoelectric conversion is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image pickup apparatus including:
    at least one light receiving element including a color filter different in color in a sub scanning direction, and configured to photoelectrically convert incident light;
    a reading gate configured to read a signal charge from the light receiving element;
    a former-stage storage unit configured to store the signal charge read from the light receiving element;
    a latter-stage storage unit configured to store the signal charge transported from the former-stage storage unit;
    a floating diffusion configured to convert the signal charge transferred from the latter-stage storage unit into a signal voltage;
    an amplification transistor configured to generate a pixel signal corresponding to the signal voltage;
    a reset transistor configured to reset a gate voltage of the amplification transistor to a reference voltage; and
    an address transistor configured to output the pixel signal; and
    a control circuit configured to perform control so that the former-stage storage unit stores the signal charge in a storage cycle determined corresponding to a color of the color filter.

2. The solid-state image pickup apparatus according to claim 1, wherein the at least one light receiving element includes a plurality of light receiving elements, and
the former-stage storage unit and the latter-stage storage unit are provided for each of the plurality of the light receiving elements.

3. The solid-state image pickup apparatus according to claim 1,
wherein
the control circuit controls the storage cycle of the signal charge in the former-stage storage unit for each color filter of a same color.

4. The solid-state image pickup apparatus according to claim 1,
wherein
the control circuit performs control so that the former-stage storage unit stores the signal charge in the storage cycle determined for each pixel including the color filter of a same color.

5. The solid-state image pickup apparatus according to claim 1, wherein
the control circuit performs control so that the pixel signal of a pixel including the color filter of each color is synchronously outputted.

6. The solid-state image pickup apparatus according to claim 1, wherein
the control circuit performs control so that a pixel including the color filter of each color is synchronized according to a position in a main scanning direction perpendicular to the sub scanning direction to transfer the signal charge from the latter-stage storage unit to the floating diffusion.

7. The solid-state image pickup apparatus according to claim 1, including
an intermediate storage unit, wherein
the intermediate storage unit is provided between the former-stage storage unit and the latter-stage storage unit, and stores the signal charge.

8. The solid-state image pickup apparatus according to claim 7,
wherein
the control circuit controls the storage cycle in which the former-stage storage unit, the intermediate storage unit and the latter-stage storage unit store the signal charge according to a color of the color filter.

9. A solid-state image pickup apparatus including
a first color pixel and a second color pixel, wherein
the first color pixel includes:
a first former-stage storage unit configured to store a first signal charge obtained by photoelectric conversion at a first exposure cycle and read from at least one first light receiving element including a color filter different in color in a sub scanning direction;
a first latter-stage storage unit to which the first signal charge is transported from the first former-stage storage unit, and which is configured to store the first signal charge before start of a signal output cycle; and
a first charge-voltage conversion circuit configured to output a first pixel signal corresponding to the first signal charge transferred from the first latter-stage storage unit in the signal output cycle, and
the second color pixel includes:
a second former-stage storage unit configured to store a second signal charge obtained by photoelectric conversion at second exposure cycle different from the first exposure cycle and read from at least one second light receiving element including the color filter different in color in the sub scanning direction;
a second latter-stage storage unit configured to store the second signal charge transported from the second former-stage storage unit before start of the signal output cycle; and
a second charge-voltage conversion circuit configured to output a second pixel signal corresponding to the second signal charge transferred from the second latter-stage storage unit in the signal output cycle,
the solid-state image pickup apparatus comprises a control circuit configured to control so that the first former-stage storage unit and the second former-stage storage unit respectively store the first signal charge and the second signal charge in a storage cycle determined corresponding to a color of the color filter.

10. The solid-state image pickup apparatus according to claim 9, wherein
the first light receiving element includes a plurality of first light receiving elements and the second light receiving element includes a plurality of second light receiving elements,
the first former-stage storage unit and the first latter-stage storage unit are provided for each of the plurality of the first light receiving elements, and
the second former-stage storage unit and the second latter-stage storage unit are provided for each of the plurality of the second light receiving elements.

11. The solid-state image pickup apparatus according to claim 9,
wherein the control circuit controls, for each color filter of a same color, the storage cycle of the first signal charge and the second signal charge in the first former-stage storage unit and the second former-stage storage unit.

12. The solid-state image pickup apparatus according to claim 9,
wherein the control circuit performs control so that the first former-stage storage unit stores the first signal charge and the second former-stage storage unit stores the second signal charge in the storage cycle determined for each first color pixel including the color filter of a same color and for each second color pixel including the color filter of a same color.

13. The solid-state image pickup apparatus according to claim 9,
wherein the control circuit performs control so that the first pixel signal of the first color pixel including the color filter of each color is synchronously outputted and the second pixel signal of the second color pixel including the color filter of each color is synchronously outputted.

14. The solid-state image pickup apparatus according to claim 9,
wherein the control circuit performs control, according to a position in a main scanning direction perpendicular to the sub scanning direction, so that
the first color pixel including the color filter of each color is synchronized to transfer the first signal charge from the first latter-stage storage unit to a first floating diffusion configured to convert the first signal charge into a first signal voltage, and
the second color pixel including the color filter of each color is synchronized to transfer the second signal charge from the second latter-stage storage unit to a second floating diffusion configured to convert the second signal charge into a second signal voltage.

15. The solid-state image pickup apparatus according to claim 9, including a first intermediate storage unit and a second intermediate storage unit,
    wherein the first intermediate storage unit is provided between the first former-stage storage unit and the first latter-stage storage unit, and stores the first signal charge, and
    the second intermediate storage unit is provided between the second former-stage storage unit and the second latter-stage storage unit, and stores the second signal charge.

16. The solid-state image pickup apparatus according to claim 15,
    wherein the control circuit controls, according to a color of the color filter, the storage cycle in which the first former-stage storage unit, the first intermediate storage unit and the first latter-stage storage unit store the first signal charge and the storage cycle in which the second former-stage storage unit, the second intermediate storage unit and the second latterstage storage unit store the second signal charge.

\* \* \* \* \*